United States Patent [19]

Inoue

[11] Patent Number: 4,707,626
[45] Date of Patent: Nov. 17, 1987

[54] INTERNAL TIME-OUT CIRCUIT FOR CMOS DYNAMIC RAM

[75] Inventor: Shinji Inoue, Houston, Tex.

[73] Assignee: Texas Instruments Incorporated, Dallas, Tex.

[21] Appl. No.: 634,897

[22] Filed: Jul. 26, 1984

[51] Int. Cl.[4] .................. H03K 3/284; H03K 5/153; H03K 19/094; H03K 17/30

[52] U.S. Cl. ............................. 307/625; 307/451; 307/246; 307/273

[58] Field of Search .............. 307/451, 273, 265, 269, 307/491, 246, 601–603, 605, 608

[56] References Cited

U.S. PATENT DOCUMENTS

| | | | |
|---|---|---|---|
| 3,504,200 | 3/1970 | Avellar | 307/265 X |
| 3,532,993 | 10/1970 | Kennedy | 307/608 X |
| 3,659,214 | 4/1972 | Iijima | 307/273 X |
| 3,761,743 | 9/1973 | Barber | 307/273 |
| 3,772,535 | 11/1973 | Tuten | 307/273 |
| 4,065,721 | 12/1977 | Rabe | 307/265 X |
| 4,277,697 | 7/1981 | Hall et al. | 307/265 |
| 4,408,168 | 10/1983 | Higuchi | 307/605 X |

OTHER PUBLICATIONS

Weil, "Feedback Triggers One-Shot from Both Polarity Edges", *Electronics*, p. 87, 7/20/1970.
Chung, "Multiphase One Shot Provides Pulses", *Electronic Engineering*, p. 21, 9/1976.

Primary Examiner—John S. Heyman
Attorney, Agent, or Firm—John G. Graham

[57] ABSTRACT

A delay circuit for internal clock generation in a dynamic RAM uses a one-shot multivibrator composed of a pair of cross-coupled CMOS NOR gates with a RC delay circuit in the coupling path between the output of one NOR gate and the input of the other. The RC delay circuit uses an MOS transistor as the resistor, with the gate of this device connected to the supply voltage, so the resistance varies with changes in the supply. A CMOS inverter stage in the delay circuit has its input connected across the capacitor of the RC delay, so the trip point will vary with threshold voltage. In a dynamic RAM, this circuit may be used to establish the critical timing between write and read mode.

4 Claims, 2 Drawing Figures

Fig.1

INTERNAL TIME-OUT CIRCUIT FOR CMOS DYNAMIC RAM

BACKGROUND OF THE INVENTION

This invention relates to semiconductor devices, and more particularly to CMOS delay circuits of the type used for internal time-out functions in clock generators for VLSI semiconductor dynamic memory devices, or the like.

Semiconductor dynamic memory devices of the N-channel type of the type shown, for example, in U.S. Pat. No. 4,239,993, issued to McAlexander, White and Rao, assigned to Texas Instruments, employ a large number of internal clocks which are generated using delay circuits such as that as illustrated in U.S. Pat. No. 4,239,990, issued to Hong and Redwine, assigned to Texas Instruments, or in pending application Ser. No. 419,118, filed Sept. 16, 1982 by Reddy, and now U.S. Pat. No. 4,521,701, also assigned to Texas Instruments. When manufacturing dynamic memory devices using CMOS processing, however, the delay stages must be of course redesigned to minimize the power dissipation commensurate with the low-power characteristics of the remainder of the CMOS circuitry.

It is the principal object of this invention to provide improved CMOS delay circuits for semiconductor integrated circuits such as dynamic memory devices. Another object is to provide time-out circuits which are compensated for variations in the supply voltage, and for threshold voltage changes due to processing and temperature variations.

SUMMARY OF THE INVENTION

In accordance with one embodiment of the invention, a delay circuit for internal clock generation in a dynamic RAM uses a one-shot multivibrator composed of a pair of cross-coupled CMOS NOR gates with an RC delay circuit in the coupling path between the output of one NOR gate and the input of the other. The RC delay circuit uses an MOS transistor as the resistor, with the gate of this device connected to the supply voltage, so the resistance varies with changes in the supply. A CMOS inverter stage in the delay circuit has its input connected across the capacitor of the RC delay, so the trip point will vary with threshold voltage. In a dynamic RAM, this circuit may be used to establish the critical timing between write and read mode.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
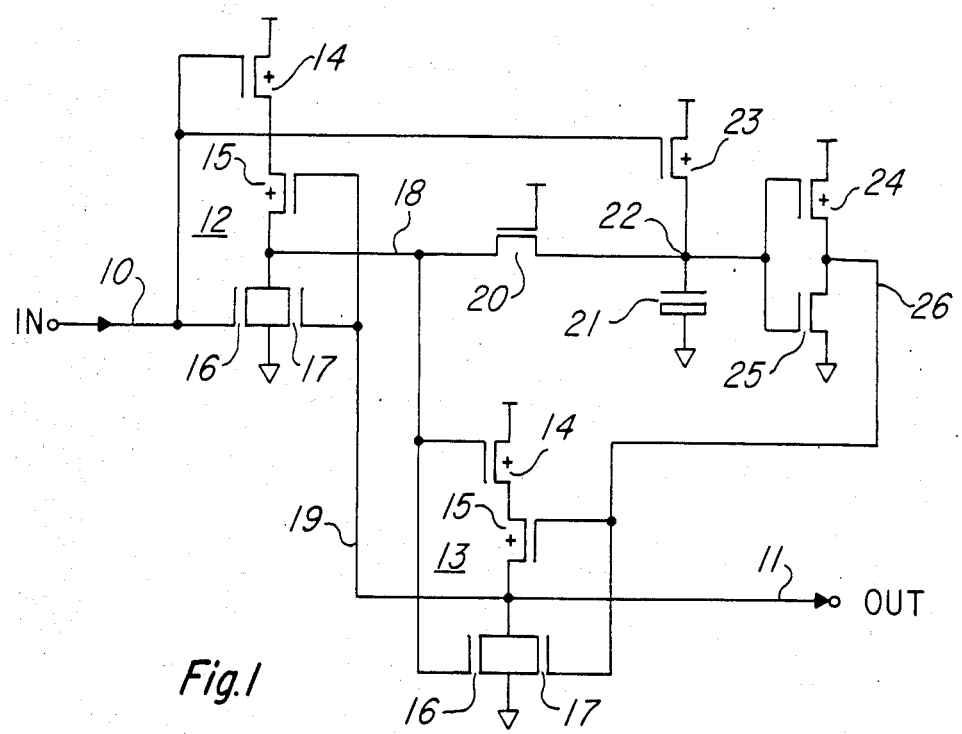
FIG. 1 is an electrical circuit diagram of a CMOS delay circuit according to the invention.

With reference to FIG. 1, a monostable circuit according to the invention receives an input signal at input node 10 and produces an output at node 11 which follows the input node by a fixed delay. The circuit includes first and second cross-coupled CMOS NOR gates 12 and 13, each having series-connected P channel transistors 14 and 15 and parallel N channel transistors 16 and 17. An output node 18 of the NOR gate 12 is coupled to the input of the NOR gate 13 at the gates of transistors 14 and 16. Likewise, an output 19 of the NOR gate 13 is coupled to the input of the NOR gate 12 at the gates of transistors 15 and 17. The node 18 at the output of the NOR gate 12 is also coupled to the input of an RC delay circuit made up of an N channel transistor 20 and a capacitor 21. A node 22 between the transistor 20 (functioning as a resistor) and the capacitor is charged to Vdd through a P channel transistor 23 which has its gate connected to the input 10. The node 22 is the input of a CMOS inverter made up of P channel transistor 24 and N channel transistor 25. The output node 26 of this inverter is coupled to the input of the NOR gate 13 at the gates of transistors 15 and 17.

Figure 2:
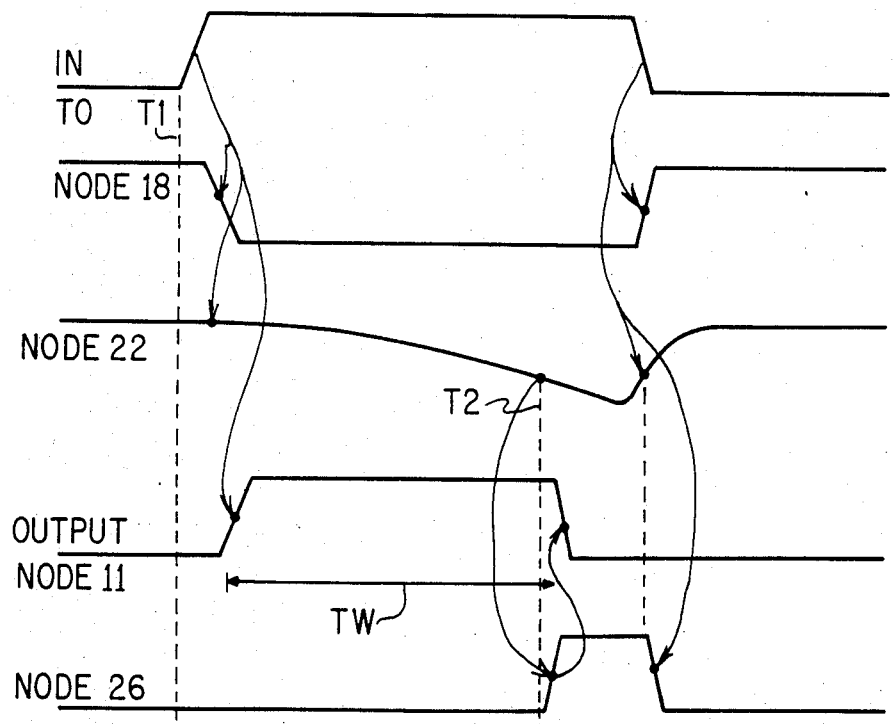
FIG. 2 is a timing diagram showing voltage as a function of time for various nodes in the circuit of FIG. 1.

The operation of the circuit of FIG. 1 is explained in reference to the waveforms of FIG. 2. In the time period T0 when the input 10 is at zero volts, the P channel transistors 14 and 23 are held on, charging node 22 to Vdd thus turning off the transistor 24 and turning on the transistor 25, so node 26 is held low. With node 22 high, node 18 is held high through the transistor 20. This voltage on the node 18 holds the N channel transistor 16 on in NOR gate 13, so the output node 11 is low. The low voltage on output node 11 holds the P-channel transistor 15 on and N channel transistor 17 off in the NOR gate 12; both transistors 14 and 15 are on so the node 18 is held high.

At time T1 when input node 10 goes high, the node 18 will drop immediately as the N channel transistor 16 turns on in NOR gate 12. The node 22 begins to discharge through the tranistors 20 and 16. With the node 26 still low, the output node 11 goes high because the P channel transistors 14 and 15 of the NOR gate 13 are both on. As the node 22 decays toward zero, at time T2 it reaches the threshold voltage of the tranistors 24 and 25 so the P channel transistor 24 begins to turn on as the N channel transistor 25 turns off. This drives the node 26 high, which turns on the N channel transistor 17 and turns off P channel transistor 15, pulling the output node 11 low in the NOR gate 13. The pulse width Tw of the output (between T1 and T2) is dependent upon the magnitude of the resistance of the transistor 20 and the threshold voltages of the inverter transistors 24 and 25, as well as the value of capacitor 21. The gate of the transistor 20 is connected to Vdd, so the delay decreases with increases in Vdd. Also, the delay period increases with an increase in the N-channel Vt of transistor 25, or a more positive P-channel threshold Vt of the transistor 24, both related to process variations and temperature. These are the desired directions of change.

The period Tw during which the output is high can be expressed approximately as $$Tw = RC \ln (Vdd/Vt)$$

where Vt is the effective threshold of the inverter. For example, with the resistance about 50 Kohm, using an N-channel transistor 20 of channel width 5 microns and channel length twenty microns, and a capacitance of the device 21 about 250 pf (size 15×10 microns), then the pulse width Tw is:

8 ns at Vdd=6 v, temp= −20° C.
11 ns at Vdd=5 v, temp=30° C.
17 ns at Vdd=4 v, temp=100° C.

While this invention has been described with reference to an illustrative embodiment, this description is not intended to be constructed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A time delay circuit comprising:
   a signal input and a signal output;
   a first CMOS NOR gate having first and second inputs and an output;
   a second CMOS NOR gate having first and second inputs and an output;
   RC delay circuit means having an input and an output;
   said RC delay circuit means including inverter means having an input and an output;
   said RC delay circuit means including resistance means connected between said output of the first NOR gate and said input of the inverter means;
   said RC delay circuit means including a capacitance connected between said input of the inverter means and ground;
   means connecting the first input of the first NOR gate to said signal input, means connecting the output of the first NOR gate to the first input of the second NOR gate and the complementing transistor thereof, means connecting the output of the second NOR gate to the second input of the first NOR gate, and means connecting the output of the second NOR gate to said signal output;
   and means coupling the output of the inverter means to the second input of the second NOR gate and the complementing transistor thereof;
   wherein each of said first and second CMOS NOR gates includes a further separate P-channel transistor connecting the NOR gate to a voltage supply, the gate of said P-channel transistor for the first NOR gate being directly connected to said signal input, whereby said P-channel transistor of the first NOR gate is on when the voltage on the signal input is low; and wherein the gate of said P-channel transistor for the second NOR gate is directly connected to said output of the first NOR gate,
   wherein a P-channel transistor having its gate directly connected to said signal input is coupled between said input of said inverter means and said voltage supply, wherby said input is charged to said voltage supply when said voltage on the signal input is low.

2. A time delay circuit comprising:
   a signal input and a signal output;
   a first CMOS NOR gate having first and second inputs and an output;
   a second CMOS NOR gate having first and second inputs and an output;
   RC delay circuit means including inverter means having an input and an output; said RC delay circuit means including variable resistance means comprised of a transistor having a source-to-drain path connected between said output of the first NOR gate and said input of the inverter means, said transistor having a gate connected to a constant voltage, whereby changes in delay in the delay circuit means is compensated by the constant voltage; said RC delay circuit means including a capacitance connected between said input of the inverter means and ground;
   means connecting the first input of the first NOR gate to said signal input, connecting said output of the first NOR gate to said input of the RC delay circuit and to the first input of the second NOR gate, connecting the output of the inverter means to the second input of the second NOR gate, and connecting the output of the second NOR gate to said signal output and to said second input of the first NOR gate,
   wherein said inverter means includes a CMOS inverter circuit having a threshold voltage at which its output rapidly changes state, and wherein the charging of said capacitor defines a delay period of said delay circuit.

3. A delay circuit comprising:
   a signal input and a signal output;
   a first CMOS NOR gate; the first NOR gate including first and second N channel transistors having source-to-drain paths in parallel, and including first and second P-channel transistors having source-to-drain paths in series connected between a voltage supply and the source-to-drain paths of said first and second N-channel transistor forming an output therefor with respect to ground;
   a second CMOS NOR gate; the second NOR gate including third and fourth N channel transistors having source-to-drain paths in parallel, and including third and fourth P-channel transistors having source-to-drain paths in series connected between said voltage supply and the source-to-drain paths of said third and fourth N-channel transistors forming and output therefor with respect to ground;
   RC delay circuit means having an input and an output;
   said RC delay circuit means including inverter means having an input and an output, and including resistance means connected between said output of the first NOR gate and said input of the inverter means;
   said RC delay circuit means including a capacitance connected between said input of the inverter means and ground;
   means connecting the gate of the first N-channel transistor to said signal input, means connecting an output of the first NOR gate to the gate of the third N-channel transistor, means connecting an output of the second NOR gate to the gate of the second N-channel transistor and to the gate of the second P-channel transistor, and means connecting an output of the second NOR gate to said signal output;
   and means coupling said output of the first NOR gate to the input of the delay circuit means, and couplng the output of the inverter means to the gate of the fourth P-channel transistor and fourth N-channel transistor of the second NOR gate;
   wherein the gate of said first P-channel transistor for the first NOR gate is directly connected to said signal input, whereby said first P-channel transistor of the first NOR gate is on when the voltage on the signal input is low;
   wherein the gate of the third P-channel transistor of the second NOR gate is directly connected to said output of the first NOR gate; and wherein a fifth P-channel transistor has its gate directly connected to said signal input and its source-to-drain path coupled between said input of said inverter means and said voltage supply, whereby said input is charged to said voltage supply when said voltage on the signal input is low.

4. A delay circuit comprising:
a signal input and a signal output;
a first CMOS NOR gate; the first NOR gate including first and second N channel transistors having source-to-drain paths in parallel, and including first and second P-channel transistors having source-to-drain paths in series connected between a voltage supply and the source-to-drain paths of said first and second N-channel transistors forming a output therefor with respect to ground;
a second CMOS NOR gate; the second NOR gate including third and fourth N channel transistors having source-to-drain paths in parallel, and including third and fourth P-channel transistors having source-to-drain paths in series connected between said voltage supply and the source-to-drain paths of said third and fourth N-channel transistors forming an output therefor with respect to grounds;
RC delay circuit means having an input and an output; wherein said RC delay circuit means includes inverter means having an input and an output, and includes resistance means connected between said output of the first NOR gate and said input of the inverter means; and includes a capacitor connected between the input of the inverter means and ground; said resistance means being an MOS transistor having a gate connected to said voltage supply;
means connecting the gates of the first N-channel transistor and the first P-channel transistor to said signal input, means connecting an output of the first NOR gate to the gate of the third N-channel transistor and to the gate of the third P-channel transistor, means connecting an output of the second NOR gate to the gate of the second N-channel transistor and to the gate of the second P-channel transistor, and means connecting an output of the second NOR gate to said signal output;
and means coupling the output of the inverter means to the gate of the fourth N-channel transistor and the gate of the fourth P-channel transistor;
wherein said inverter means includes a CMOS inverter circuit having a threshold voltage at which its output rapidly changes state, and wherein the charging of said capacitor defines a delay period of said delay circuit.

* * * * *